(12) United States Patent
Johnson et al.

(10) Patent No.: US 8,348,731 B2
(45) Date of Patent: Jan. 8, 2013

(54) ADAPTIVE COOLING METHOD FOR COMPUTER RACK ENCLOSURE

(75) Inventors: Douglas A. Johnson, Groveland, MA (US); Stephen B. Boyd, Merrimac, MA (US)

(73) Assignee: Wilmington Research and Development Corporation, Newburyport, MA (US)

( * ) Notice: Subject to any disclaimer, the term of this patent is extended or adjusted under 35 U.S.C. 154(b) by 1429 days.

(21) Appl. No.: 11/499,916

(22) Filed: Aug. 4, 2006

(65) Prior Publication Data

US 2007/0097636 A1    May 3, 2007

Related U.S. Application Data

(60) Provisional application No. 60/705,793, filed on Aug. 5, 2005.

(51) Int. Cl.
  *H05K 5/00* (2006.01)
  *H05K 7/20* (2006.01)
  *G01F 1/68* (2006.01)
(52) U.S. Cl. .............. 454/184; 361/695; 73/204.11
(58) Field of Classification Search .......... 454/184; 361/695; 73/204.11, 204.12
  See application file for complete search history.

(56) References Cited

U.S. PATENT DOCUMENTS

| | | | | |
|---|---|---|---|---|
| 4,566,807 A | * | 1/1986 | Koolen | 374/112 |
| 4,770,037 A | * | 9/1988 | Noir et al. | 73/204.12 |
| 5,119,674 A | * | 6/1992 | Nielsen | 73/204.24 |
| 5,131,887 A | * | 7/1992 | Traudt | 454/255 |
| 5,212,983 A | * | 5/1993 | Ott et al. | 73/204.15 |
| 5,592,363 A | * | 1/1997 | Atarashi et al. | 361/689 |
| 5,860,858 A | * | 1/1999 | Wettergren | 454/343 |
| 5,980,102 A | * | 11/1999 | Stulen et al. | 374/45 |

(Continued)

FOREIGN PATENT DOCUMENTS

DE    101 46 385 A1    4/2003

(Continued)

OTHER PUBLICATIONS

Extended Supplementary European Search Report of International Application No. EP 06 800 749.1; dated Feb. 25, 2011, 20 pages.

(Continued)

*Primary Examiner* — Steven B McAllister
*Assistant Examiner* — Frances H Kamps
(74) *Attorney, Agent, or Firm* — Hamilton, Brook, Smith & Reynolds, P.C.

(57) ABSTRACT

A technique for cooling equipment racks that contain multiple individual devices, such as computers, that each have their own internal cooling fans. An air passage ("shunt tube") is placed between a compartment inside the rack, and the ambient air outside the rack, or between compartments inside the rack. Sensors inside the air passage detect movement of the air inside the passage, and thus indirectly measure the presence of a differential pressure. The preferred sensor embodiment uses temperature sensors, and takes advantage of the differences of the air temperatures inside the computer rack, and outside the computer rack (or between internal computer rack compartments) to determine if the air is moving through the air passage, and which direction the air is moving. In response to the measurements, a control system is configured to drive the plenum to a slight vacuum, and then slowly reduce an exhaust fan until the plenum is slightly pressurized, at which point the fan speeds up and again creates a slight vacuum. This allows the rack enclosure to continuously adapt to any changes in cooling requirements, as the computer utilization changes.

6 Claims, 4 Drawing Sheets

U.S. PATENT DOCUMENTS

| | | | |
|---|---|---|---|
| 6,185,097 B1 * | 2/2001 | Behl | 361/695 |
| 6,266,243 B1 * | 7/2001 | Tomioka | 361/695 |
| 6,487,904 B1 * | 12/2002 | Myhre | 73/204.12 |
| 6,535,382 B2 | 3/2003 | Bishop et al. | |
| 6,543,282 B1 * | 4/2003 | Thompson | 73/204.15 |
| 6,639,506 B1 * | 10/2003 | Landis | 338/25 |
| 6,684,944 B1 * | 2/2004 | Byrnes et al. | 165/247 |
| 6,699,119 B2 * | 3/2004 | Boulanger et al. | 454/61 |
| 6,711,937 B2 * | 3/2004 | Richards et al. | 73/29.01 |
| 6,883,369 B1 * | 4/2005 | Myhre | 73/204.12 |
| 6,897,774 B2 * | 5/2005 | Costa et al. | 340/522 |
| 6,936,767 B2 * | 8/2005 | Kleinecke et al. | 174/50 |
| 6,940,716 B1 * | 9/2005 | Korinsky et al. | 361/695 |
| 6,983,652 B2 * | 1/2006 | Blakley et al. | 73/204.22 |
| 7,036,368 B2 * | 5/2006 | Akamatsu et al. | 73/204.25 |
| 7,051,589 B2 * | 5/2006 | Igarashi et al. | 73/202.5 |
| 7,201,048 B2 * | 4/2007 | Renninger et al. | 73/204.15 |
| 7,285,147 B2 * | 10/2007 | Kuo et al. | 55/385.2 |
| 7,632,459 B2 * | 12/2009 | Lentz et al. | 422/24 |
| 2003/0181158 A1 * | 9/2003 | Schell et al. | 454/229 |
| 2004/0020286 A1 * | 2/2004 | Blakley et al. | 73/204.26 |
| 2004/0099747 A1 * | 5/2004 | Johnson et al. | 236/49.3 |
| 2004/0109288 A1 | 6/2004 | Beitelmal et al. | |
| 2004/0112582 A1 * | 6/2004 | Beitelmal et al. | 165/247 |
| 2004/0194371 A1 * | 10/2004 | Kinnis | 47/17 |
| 2005/0109764 A1 * | 5/2005 | Kopel | 219/494 |
| 2006/0071089 A1 * | 4/2006 | Kates | 236/94 |
| 2007/0221198 A1 * | 9/2007 | Yi | 126/299 R |

FOREIGN PATENT DOCUMENTS

| | | |
|---|---|---|
| EP | 0 857 012 A1 | 8/1998 |
| JP | 05-103708 | 4/1993 |
| JP | 06026962 A * | 2/1994 |
| JP | 07-121242 | 5/1995 |

OTHER PUBLICATIONS

Actualité—Technologies, "La Sécurité Thermique Par Mesure De Flux D'Air," 2045 Electronique, (Oct. 1990), No. 1, Paris, FR.

International Preliminary Report on Patentability and Written Opinion of the International Searching Authority, dated Feb. 14, 2008, of International Application No. PCT/US2006/030433, 6 pages.

Baker, Bonnie C., "Termistors in Single Supply Temperature Sensing Circuits," Microchip, AN685, 1999 Microchip Technology, pp. 1-11.

* cited by examiner

ADAPTIVE COOLING METHOD FOR COMPUTER RACK ENCLOSURE

RELATED APPLICATION(S)

This application claims the benefit of U.S. Provisional Application No. 60/705,793, filed on Aug. 5, 2005. The entire teachings of the above application(s) are incorporated herein by reference.

BACKGROUND OF THE INVENTION

It has been estimated that in most of today's data centers, electronic equipment racks generate between 5 to 12 Kilo-Watts (KW) of heat. The newest computers (servers) being used in data centers are smaller and more powerful, and allow for a very dense placement of machines inside an equipment rack enclosure. Some estimates are that future heat loads inside equipment racks could go beyond 20 KW. The cooling systems used in these equipment racks are clearly important to the reliability of these data centers.

Efficiency is one of the most important aspects of a rack cooling system. The high cost of air conditioning precludes simply making and distributing more cold air than is needed for cooling. The most efficient system will deliver the right amount of cold air to the computer rack—no more, and no less.

Determining the ideal cooling rate for an equipment rack is difficult because the amount of heat generated can vary greatly. For example, computers sitting idle generate far fewer watts than those being heavily used. So if the entire rack is idle, the cooling demand will be significantly lower than if the entire rack is hard at work. Additionally, the number and type of equipment installed in the rack may change over time. A rack that is only half full of servers today may be completely full next week.

Another related challenge is due to the fact that the internal heat being generated is exhausted from the rear of each of the computers by cooling fans that are internal to each computer. Obviously, the combined airflow produced by these cooling fans must be properly managed. If this airflow is mismanaged, hot air exhausting from the rear of the computers could migrate to the front of the cabinet where it would mix with the cold air supply, and have a detrimental effect on cooling.

Finally, computer manufacturers typically publish "ambient" conditions for which their equipment is designed. The ideal equipment rack cooling system will thus maintain the desired ambient conditions to the internally monitored computers, while using the minimum amount of cooling necessary. In order to do this, the cooling system must not only provide the proper air temperature, it must also insure there are no pressure differentials between the entrance and the exhaust of the internal computers. In other words, the computers must not be allowed to pressurize the rear of the equipment rack, when all their internal fans are running. This could otherwise cause the airflow in Cubic Feet per Minute (CFM) inside the computers to drop, resulting in elevated internal temperatures. Likewise, the computer fans must not be allowed to pull a vacuum in the front of the rack, or again the CFM inside the computers could drop. Alternatively, the cooling system should neither pressurize the front of the rack, nor create a vacuum in the rear of the rack, as either of these conditions would force more cooling air to circulate than is necessary, resulting in reduced efficiency.

SUMMARY OF THE INVENTION

We have come to understand that implementing an ideal equipment rack cooling technique, involves considering that the individual computers/servers themselves monitor their own internal temperatures, and modulate their internal cooling fans based on their own cooling needs. As they heat up, they speed up their internal cooling fans, and as they cool down, the fans slow down. Not surprisingly, the manufacturers of the individual computers have built in the ideal amount of cooling that each one needs based on its current usage.

Therefore, the equipment rack cooling system needs to match the CFM demand of all the individual computers in the rack. This will insure that there are no pressure differentials across the servers, and will let the computers cool themselves correctly as though they were sitting in open ambient room conditions.

One way to implement this is by using pressure transducers to measure the pressure in the front of the rack, and/or in the back of the rack. Thus if the computers speed up their internal fans, and the back of the cabinet is not being exhausted fast enough, a slight increase in pressure will be detected, indicating that the cooling system exhaust fans need to speed up. Then when the rear pressure again equalizes, the exhaust fan CFM has matched the combined CFM demand of computers in the rack.

The problem with using pressure transducers is that the observed pressure differential is typically very small, on the order of 0.1 inches of water (0.0036 PSI), or less. Pressure transducers that can accurately measure this low range of pressure are relatively expensive. Additionally, any pressure transducer that is chosen has a minimum pressure sensing capability, below which the transducer will not work. The lower the specified minimum is, the more expensive the transducer is. Then there is an issue of robustness. A very sensitive pressure transducer is going to be less robust, than a not so sensitive one. Building a very robust, very sensitive pressure transducer, is very expensive. The high cost of this approach is a problem for computer rack system designers from several perspectives. It makes using multiple pressure transducers, to obtain better, or redundant information, impractical.

Also, there are competing technologies for equipment rack cooling, such as simply measuring rack exhaust temperature. And while some of these techniques may be inferior, they provide a price point metric, and may work "good enough". These low cost, already available solutions make it difficult to successfully market a high cost approach.

What is needed is a low cost and robust way to measure if the cooling system air flow is matched to the combined CFM of the individual computer's cooling fans. Thus if the computer's internal fans change speed because more or less cooling is needed, the rack cooling system can sense the change and adapt, to provide the same CFM as is demanded by the computers.

More specifically, the present current invention describes a technique for detecting a difference in CFM between the internal fan of the computer/servers and the equipment rack cooling system (air handling system), by using a difference in temperatures that exist within areas inside the rack, and/or outside the rack. The technique involves inserting air passages, between these areas, with temperature sensors positioned inside the air passage, or at either end (or both ends) of the air passage. By monitoring the temperatures of the air within, or at either end of the air passage, and then measuring the temperature of the air inside the air passage, a mismatch in flow-rates (CFM) between air entering an area, and air leaving the area, can be detected. This is because the difference in CFM will cause air to flow though the air passage, the direction of which can be known by knowing which air mass (which end of the air passage) is flowing through the air passage. The current invention then teaches the use of this CFM difference detection method, for use in systems which cool computer racks.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of preferred embodiments of the invention follows.

Figure 1:
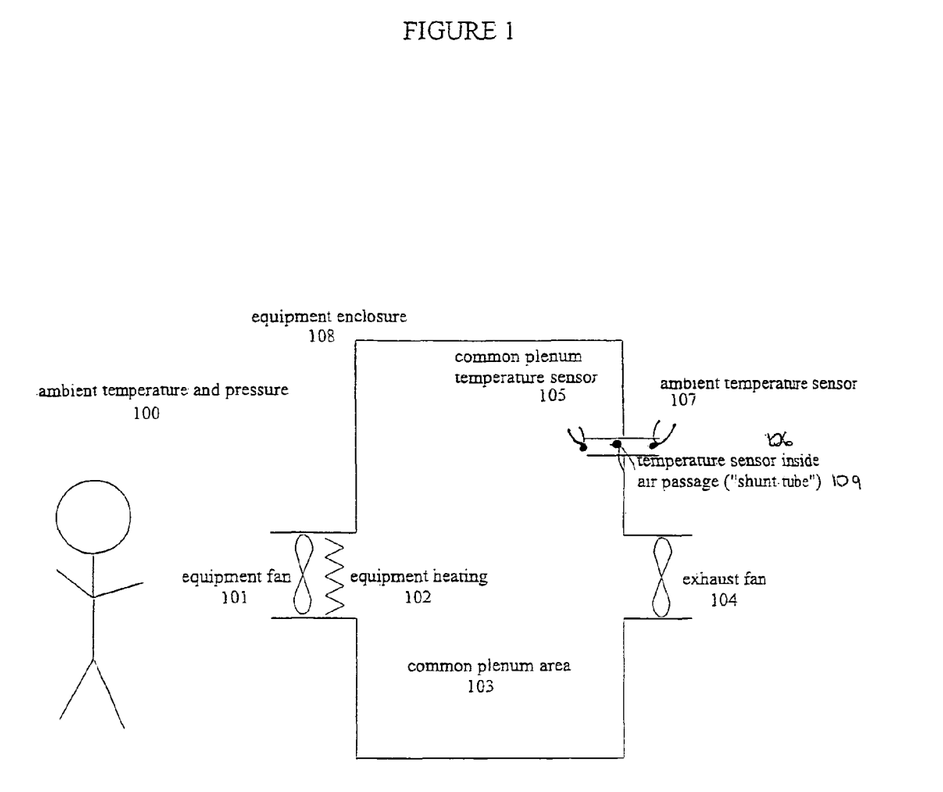
FIG. 1 is a high level diagram of the different detection techniques.

One basic CFM difference detection method according to the invention shown in FIG. 1. The technique involves an equipment rack or enclosure (108) that has at least one piece of equipment (such as a computer) with a fan (101) that blows air into a common plenum area (103). The equipment also generates heat (102) so that the air that goes into the common plenum area is heated above ambient temperature. The equipment enclosure also has an exhaust fan (104) that is meant to exhaust the heated air from the common plenum area, at the same CFM as is being introduced into the common plenum area, by the equipment fan (101). Temperature sensors include plenum sensor (105) for measuring the temperature of the air in the common area (103), ambient sensor (107), for measuring the temperature of the ambient room air (100), and sensor (106) for measuring the temperature of the air inside a small air passage ("shunt tube") (109) between the common area (103) and the outside ambient room.

The Sensor (106) is typically placed in the middle of shunt tube (109) inside enclosure (108) and ambient sensor (107) on the other end of tube (109) that is outside enclosure (108) that permits a single shunt tube (109) to carry all three sensors. However, sensors (105, 107) may be individually monitored in other locations in and outside enclosure (108). The CFM difference detection method works because if the exhaust fan (104) is exhausting less air than the equipment fan (101) is introducing, the result is a slight pressure increase in the common plenum area (103), which will then push heated plenum air through the shunt tube (109) to the outside of the enclosure (108). Conversely, if the exhaust fan (104) is exhausting more air than the equipment fan (101) is introducing, the result is a slight pressure decrease in pressure in the common plenum area (103). This will cause cooler ambient air to enter the exhaust shunt tube (109) from outside the equipment enclosure (100). The relatively large difference in temperature between warm plenum air exiting the exhaust shunt tube, or cool ambient air entering the tube, detectable by sensors (105, 106, and/or 107) makes it easy to determine if a CFM difference exists between the equipment fan and the exhaust fan, and whether the difference is positive or negative (exhausting too little, or exhausting too much).

FIG. 1 illustrates a basic configuration for determining a difference in airflow between an equipment fan and an exhaust fan, by measuring a temperature of the air inside and outside a common plenum area and comparing this to the temperature of air moving through a shunt tube. More particularly, the CFM difference detection assembly and method thus uses simple temperature sensors, and an air passage ("shunt tube"). A very low cost and robust CFM detection sensing assembly can thus be produced for use with equipment racks. Another important aspect to this method is that because it is sensing the temperature of the air mass flowing through the shunt tube, a differential pressure of virtually zero can be detected. All that is necessary is the very slightest amount of air movement, just barely moving through the shunt tube, and the large difference in air temperature is easily and quickly detected. This CFM difference detection method provides significant performance improvements, as well as significant price reductions, over differential pressure transducers, when used in computer rack cooling applications.

It should be noted that it is possible to further reduce the cost of the CFM difference detection assembly, by reducing the number of temperature sensors from three, to two, or even one. This can be done by observing that the air inside the common plenum area (103) will always be hotter than the ambient air (100). All that is necessary is to know either the temperature of the common plenum area (103), or the ambient air (100), and then compare this to the temperature sensor inside the shunt tube (109). In a two sensors arrangement for example, with one sensor (106) inside the middle of shunt tube (109), and one sensor (107) in the ambient air (100) end, if the sensors are at the same temperature, the exhaust fan (104) must be exhausting more CFM than the equipment fan (101) is introducing. Conversely, if the exhaust fan (104) is exhausting less air than the equipment fan (101) is introducing, heated air from the common plenum area (103), will be exhausted through the shunt tube (109). Again, the relatively large temperature difference between the air in the common plenum area (103) and the ambient air (100), makes a two sensor implementation of the CFM detection method possible. Additionally, if the ambient temperature is already continuously and precisely controlled at a known temperature, common in most commercial data centers, all that is necessary is a single temperature sensor (106) placed inside the shunt tube (109). The temperature (106) inside the shunt tube (109) is simply compared to the known (programmed) ambient air temperature (100), to determine which direction the air mass is traveling through the tube (109).

Figure 2:
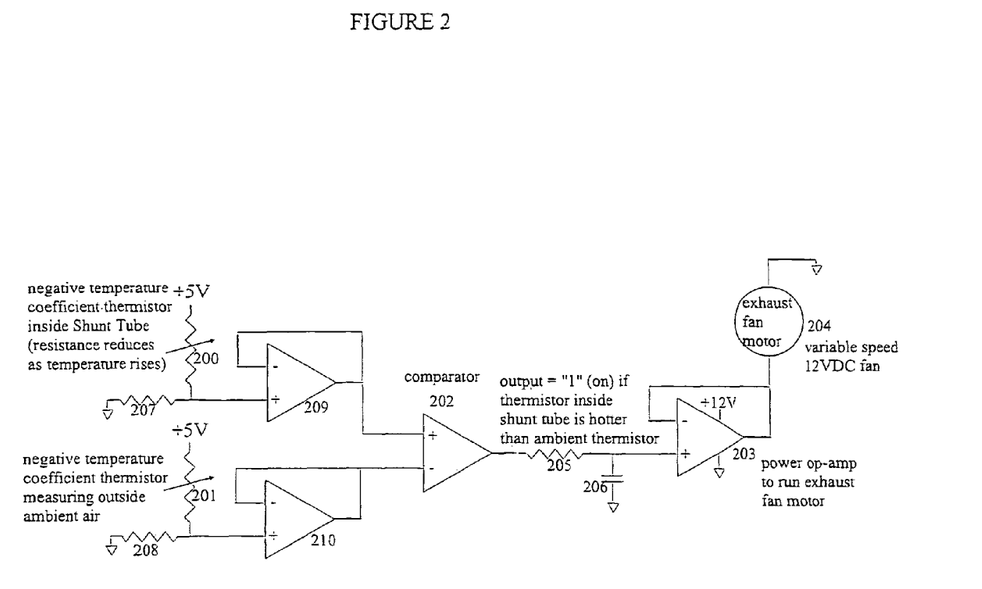
FIG. 2 is a schematic for a circuit coded to control an enclosure exhaust fan.

FIG. 2 shows an analog circuit that provides for the fundamental operation of a two sensor configuration, when one sensor (106) is in the middle of the shunt tube (109), and the second sensor (107) is in the ambient air (100) end. In this example, the two temperature sensors (200 & 201) are matched (interchangeable) negative coefficient thermistors. Each is connected to a resistor (207 & 208) to ground to form a voltage divider. The resistance values are somewhat arbitrary, but for exemplary purposes the thermistors can be 10K ohms at 25 degrees C., and the resistors to ground are 10K ohms. Resistor to ground (208) is preferably slightly larger in value than resistor (207) so that when both thermistors (200 & 201) are at the exact same temperature, the comparator (202) is guaranteed to be off.

As a result, if both sensors are at 25 degrees C., their resistances are the same (10K ohms), and they divide the 5V source voltage in half, thus generating a 2.5V signal to the "+" input of voltage followers (209 & 210). If one assumes that both voltage followers (209 & 210) are supplying the exact same voltage to the inputs of comparator (202) (the ambient air voltage follower (210) will be slightly higher because of resistor (208)), then the output of the comparator (202) will be off, and the power op-amp (203) will be off. As soon as the thermistor (200) in the shunt tube (109) senses a higher temperature than the ambient temperature thermistor (201), the "+" input of the comparator (202) will receive a higher voltage than the "−" input, and the output of the comparator will turn on (go high="1"). The comparator's (202) output is then averaged (filtered) with a R/C circuit (205 & 206). This means that the voltage coming off the capacitor (206) charges very slowly, which in turn slowly increases the voltage delivered to the exhaust fan motor (204) by the power op-amp (203). This condition continues as long as the shunt tube thermistor (200) is hotter than the ambient thermistor (201), and the voltage on the exhaust fan motor (204) continues to increase, which causes the fan (204) to run faster. When the exhaust fan motor (204) has finally reached the CFM to equalize the inside of the computer rack, outside room ambient air will begin to be drawn into the shunt tube (109), causing the two temperature sensors (200 & 201) to read the same temperature, resulting in comparator (202) turning off. The long time constant of the R/C circuit (205 & 206) will result in the exhaust fan motor (204) slowly decreasing in speed. This continues until the exhaust fan motor (204) is no longer exhausting enough CFM, at which point the shunt tube thermistor (200) will again be hotter than the ambient thermistor (201), and the whole process repeats.

Figure 3:
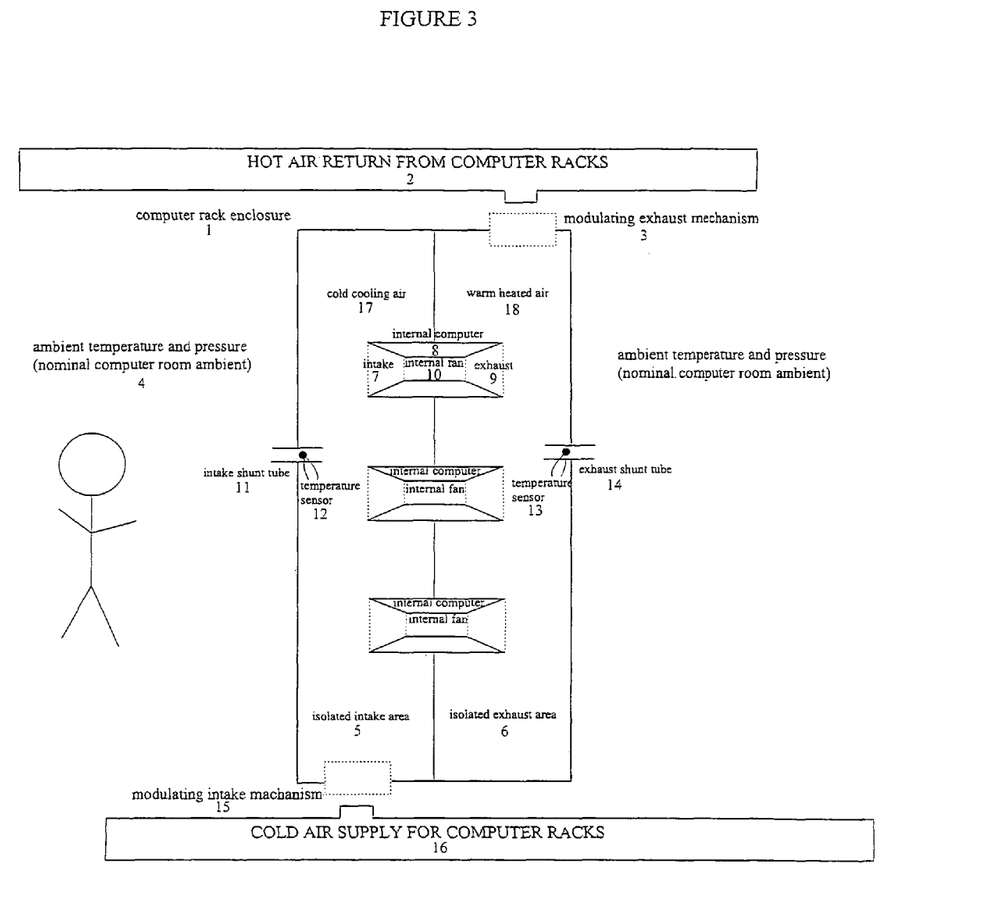
FIG. 3 illustrates an equipment rack that isolates internal intake and exhaust areas.

The basic CFM detection method described above, can be further integrated into an adaptive cooling system for computer rack enclosure by providing the arrangement shown in FIG. 3:

- a rack enclosure (1) containing one or more computing units (8);
- a cold air supply (16) to the rack enclosure (1) for the purposes of cooling the computing units (8);
- an exhaust (2) from the rack enclosure (1) for the purposes of removing the exhaust air from the computing units (8);
- a device for measuring the difference in airflow (CFM) between the incoming cold air supply and the computing units intake fans (shunt tube 11 and e.g., temperature sensor 12);
- a device for measuring the difference in airflow (CFM) between the computing units (8), internal fans (10) and the air exiting the rack enclosure exhaust (sensor 13 & shunt tube 14);
- a mechanism for modulating (15) the airflow (CFM) of the cold air supply into the rack enclosure (1);
- a mechanism for modulating (3) the airflow (CFM) of the exhaust air exiting the rack enclosure (1).

This embodiment of the invention matches the rack enclosure's incoming cold air supply (CFM) to the combined effect of the computing unit's internal intake fans, and matches the rack enclosure exhaust air (CFM) to the combined computing unit(s) exhaust fans, for the purpose of maintaining ambient pressures at the computers internal intakes (7) and at the computers internal exhausts (9). This mimics the conditions of the computers (8) simply being set up inside an air-conditioned room (7), with no rack enclosure (1). By ensuring that there is no restriction of the cold air getting to the computers air intake (i.e., no low pressure area created by intake air) and by ensuring there is no restriction of the computers exhaust (9) air (i.e., no high pressure area created by exhaust air), the computers (8) internal fans (10) work normally (as they were designed). Additionally, if the cooling is inadequate, and the computers speed up their internal cooling fans (10) to compensate, the rack enclosure (1) will adapt and continue to maintain ambient pressures at the computers intake and exhaust.

The rack enclosure design (1) as shown in FIG. 3, preferably isolates the internal computer intake areas (7) from the internal computer exhaust areas (9). The rack's isolated intake area (5) is shared (in communication with) the rack's modulating cold air inlet mechanism (15) as well as the internal computer intake areas (7). Likewise, the rack's isolated exhaust area (6) is shared (in communication with) the rack's modulating exhaust air mechanism (3) as well as the internal computer exhaust areas (9). These two isolated rack areas (intake (5) and exhaust (6)) are isolated from the exterior of the rack (4).

The nature of computer rack cooling systems allows a simplifying refinement where one can stipulate that the air being supplied to the modulating intake mechanism (16) is known to be colder than the external ambient air temperature (4), and the temperature of the air being exhausted (18) by the modulating exhaust mechanism (3) is known to be warmer than the external ambient temperature (4). This allows a simplified method of measuring the differential pressures (referred to as "CFM difference detection" earlier in this text) in the two isolated areas (5 & 6) by measuring the air temperature (via sensors 12&13) inside the two small shunt tubes (11&14), which independently connect each of these isolated areas (5&6) to the exterior of the rack (4).

Thus, for example, if the modulating exhaust mechanism (3) is exhausting too little air, resulting in a slight increase in pressure (compared to ambient) building up in the isolated exhaust area (6), this will push heated exhaust air (18) through the exhaust shunt tube (14) to the outside (4) of the rack (1). Conversely, if the modulating exhaust mechanism (3) is exhausting more air than the computer units (9), resulting in a slight decrease in pressure (compared to ambient) in the isolated exhaust area (6), this will cause ambient air (4) to enter the exhaust shunt tube (14) from outside (4) the rack (1). The relatively large difference in temperature between warm air (18) exiting the exhaust shunt tube (14), or cool ambient air (4) entering the intake tube (11) provides an inexpensive and robust temperature sensing method for determining if differential pressure (with respect to ambient) exists, and whether the difference is positive or negative.

Likewise, if the modulating inlet mechanism (15) is providing too much cooling air to rack (1), resulting in a slight increase in pressure (compared to ambient) building up in the isolated intake area (5), this will push cold cooling air (17) through the exhaust shunt tube (11) to the outside (4) of the rack (1). Conversely, if the modulating inlet mechanism (15) is not providing enough cooling air to the computer unit(s), resulting in a slight decrease in pressure (compared to ambient) in the isolated intake area (5), this will cause ambient air (4) to enter the intake shunt tube (11) from outside the rack (1). The relatively large difference in temperature between ambient air (4) entering the intake shunt tube (11), or cold cooling air (17) exiting the tube (11), provides an inexpensive and robust temperature sensing method for determining if differential pressure (with respect to ambient) exists, and whether the difference is positive or negative.

Figure 4:
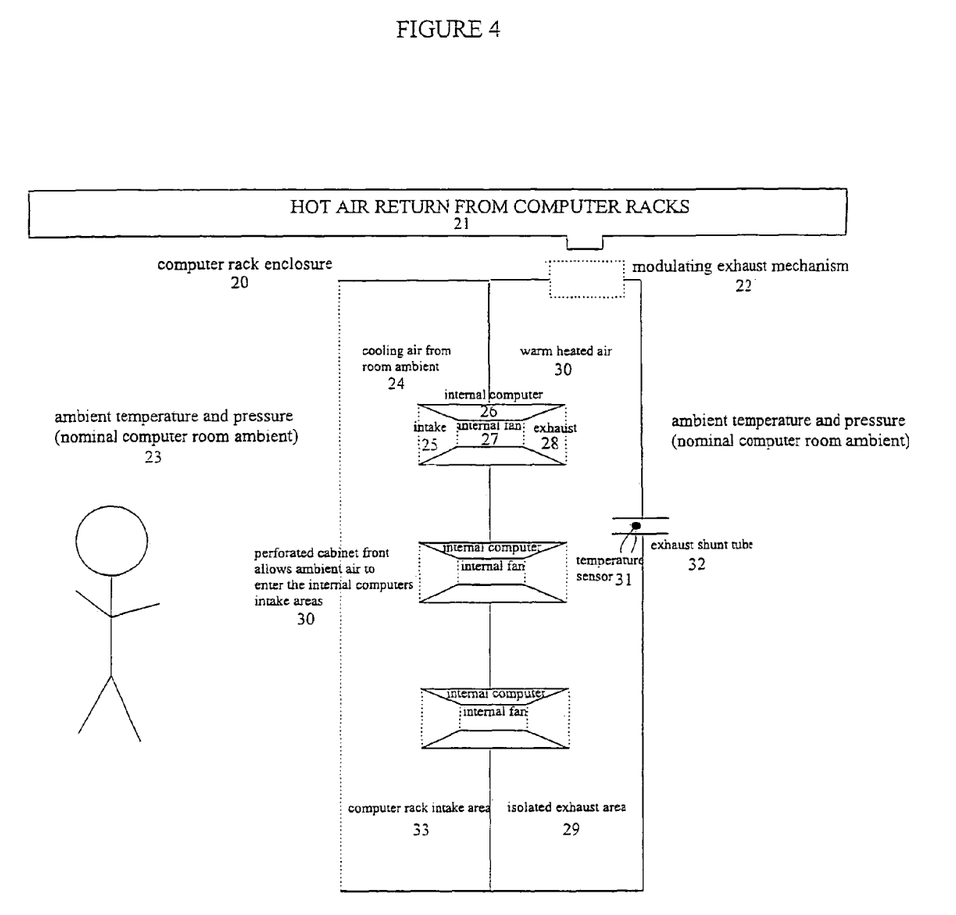
FIG. 4 illustrates an equipment rack that isolates an exhaust area only.

Another embodiment of the invention, shown in FIG. 4, uses a rack enclosure design (20) that also separates the internal computers intake areas (25) from the internal computers exhaust areas (28), but only isolates the racks exhaust area (29) from the room (23). The racks intake area (33) can be shared (in communication with) the computer room (23) as well as the internal computers intake areas (25). The isolated exhaust area (29) is shared (in communication with) the rack's modulating exhaust air mechanism (22) as well as the internal computers exhaust areas (28), and is isolated from the exterior of the rack (23).

By again stipulating that the temperature of the air being exhausted (30) by the modulating exhaust mechanism (22) is warmer than the external ambient air temperature (23), a simplified method of measuring the differential pressure (referred to as "CFM difference detection" earlier in this text) is possible.

Thus, for example, if the modulating exhaust mechanism (22) is exhausting too little air, resulting in a slight increase in pressure (compared to ambient) building up in the isolated exhaust area (29), this will push heated exhaust air (30) through the exhaust shunt tube (32) to the outside of the rack (23). Conversely, if the modulating exhaust mechanism (22) is exhausting more air than the computer units exhaust (28), resulting in a slight decrease in pressure (compared to ambient) in the isolated exhaust area (29), this will cause cooler ambient air (23) to enter the exhaust shunt tube (32) from outside the rack (23). The relatively large difference in temperature between warm air (30) exiting the exhaust shunt tube (32), or cool ambient air (23) entering the tube provides an inexpensive and robust temperature sensing (31) method for determining if differential pressure (with respect to ambient) exists, and whether the difference is positive or negative.

In practical implementations, it may be found advantageous to use multiple shunt tubes, in the place of any single shunt tubes, or to modify the shape and size of the shunt tube(s), or provide baffling, or filtering, or other mechanical adaptations. These modifications are not deemed to be important to the basic ideas set forth herein. Also, additional shunt tube placements may also be found to be advantageous, particularly between the two isolated areas (5&6) in the rack enclosure (1). This again, is considered an extension of the basic ideas presented in this description.

Another refinement to shunt tube temperature measurement concept, can be to include temperature sensors at either end, or at both ends of a shunt tube, in addition to placing a sensor in the middle. This could provide measurement benefits over the single sensor shunt tube. In particular, it is then possible to determine if the simplifying stipulations of the ambient air being cooler than the heated exhaust air, but warmer than the cold air supply for the computer rack is true. By measuring both ends of the shunt tubes, assumptions about which air mass is hotter or colder is no longer necessary, as the actual temperatures of the masses are known. It is then be possible to calculate the CFM difference, regardless of the temperatures. Also, it is possible to include a self heating element inside the shunt tube, which could provide even more information to the control system, about the pressures and temperatures in the cabinet. These, again, are viewed as extensions of the basic ideas presented in this description.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for controlling an airflow device arranged for supplying or exhausting cooling air for a rack enclosure, the method comprising the steps of:
   disposing an opening between an area inside the rack enclosure and an area outside the rack enclosure;
   measuring a first temperature, a second temperature and a third temperature at locations in thermal communication with said opening, where the measured first temperature is affected by airflow through said opening, the airflow resulting from a pressure differential across said opening;
   determining a direction of airflow though said opening from said temperature measurement, and
   controlling the airflow device in response to said direction determining step; wherein a shunt tube is disposed in the opening, the first temperature is measured at a location inside the shunt tube, the second temperature is measured at a location outside the enclosure, the third temperature is measured at a location inside the rack enclosure, and wherein the direction of airflow is determined from the first, second and third temperatures measured.

2. A method as in claim 1 wherein the second temperature is measured at one end of the shunt tube.

3. A method as in claim 1 wherein the rack enclosure further comprises an intake plenum and exhaust plenum, and the shunt tube is disposed between the intake and exhaust plenums.

4. A method as in claim 1 wherein the direction of airflow is determined by comparing an average of the second and third temperatures with the first temperature.

5. A method for controlling an airflow device arranged for supplying or exhausting cooling air for a rack enclosure, the method comprising the steps of:
   disposing an opening between an area inside the rack enclosure and an area outside the rack enclosure;
   measuring a first temperature and a second temperature at locations in thermal communication with said opening, where the measured first temperature is affected by airflow through said opening, the airflow resulting from a pressure differential across said opening;
   determining a direction of airflow though said opening from said temperature measurement, and
   controlling the airflow device in response to said direction determining step, wherein the step of determining a direction of airflow further comprises measuring a second temperature at a second location adjacent the opening and determining the direction of airflow by comparing the first and second temperatures measured, wherein the direction of airflow is determined to be a first direction when the first temperature is less than the second temperature, and the direction of airflow is determined to be a second direction when the second temperature is less than the first temperature.

6. A method as in claim 5 wherein the enclosure further encloses a data processing system having a corresponding second air mover for providing exhaust air from the data processing system.

* * * * *

UNITED STATES PATENT AND TRADEMARK OFFICE
CERTIFICATE OF CORRECTION

PATENT NO. : 8,348,731 B2
APPLICATION NO. : 11/499916
DATED : January 8, 2013
INVENTOR(S) : Douglas A. Johnson and Stephen B. Boyd It is certified that error appears in the above-identified patent and that said Letters Patent is hereby corrected as shown below:

Column 8, Claim 1, Line 13 delete "though said" and insert -- through said --

Column 8, Claim 5, Line 42 delete "though said" and insert -- through said --

Signed and Sealed this
Twenty-sixth Day of March, 2013

Teresa Stanek Rea
*Acting Director of the United States Patent and Trademark Office*